United States Patent [19]

Kurosaki et al.

[11] Patent Number: 4,551,855

[45] Date of Patent: Nov. 5, 1985

[54] RADIO COMMUNICATIONS SYSTEM FOR DETECTING THE COINCIDENCE OF DECODED INFORMATION

[75] Inventors: Masanori Kurosaki; Katsuaki Kawamura, both of Kawagoe, Japan

[73] Assignee: Pioneer Electronic Corporation, Tokyo, Japan

[21] Appl. No.: 550,387

[22] Filed: Nov. 10, 1983

[30] Foreign Application Priority Data

Nov. 15, 1982 [JP] Japan .................................. 57-200138

[51] Int. Cl.[4] .............................................. H03J 7/18
[52] U.S. Cl. ..................................... 455/161; 455/32; 455/34; 455/166
[58] Field of Search ..................... 455/32, 34, 38, 161, 455/166, 228, 62

[56] References Cited

U.S. PATENT DOCUMENTS

| 3,535,636 | 10/1970 | Muilwijk | 455/32 |
| 3,840,811 | 10/1974 | Blouch | 455/32 |
| 4,392,247 | 7/1983 | Van Deursen | 455/161 |
| 4,409,687 | 10/1983 | Berti et al. | 455/32 |
| 4,434,504 | 2/1984 | Fredrickson | 455/32 |

Primary Examiner—Jin F. Ng
Attorney, Agent, or Firm—Fleit, Jacobson, Cohn & Price

[57] ABSTRACT

A radio communications system having an automatic tuning frequency scanning operation is provided with a circuit for automatically stopping the frequency scanning operation dependent upon the comparison between the group number information in an output signal from the receiver and a group number which is previously selected by an operator of the system. In order to stop the automatic scanning operation, a signal is produced for controlling the operation of a gate circuit along with a scan signal latch circuit in the frequency synthesizing portion of the system.

2 Claims, 3 Drawing Figures

RADIO COMMUNICATIONS SYSTEM FOR DETECTING THE COINCIDENCE OF DECODED INFORMATION

BACKGROUND OF THE INVENTION

1. Field of the Invention

The present invention relates to a radio communications system and more particularly to a radio communications system having a function of detecting the coincidence of a decoded group number information and a previously selected group number.

2. Description of Background Information

There is a type of radio communications system which has a call channel and a plurality of speech channels. In this type of communcations system, called as "personal wireless communications system" for example, at least an information of non-busy speech channels and a group number information for designating the desired responding station or stations, are transmitted during originating a call. On the side of the responding station, the detected group number is compared with a group number previously selected, and a two way communications becomes possible only when the detected group number is identical with the previously selected group number. Furthermore, it is general to provide the system with a frequency scanning operation in which the tuning frequency of the system is sequentially shifted in accordance with the result of the detection of the carrier signal on the selected channel.

In the case of the radio communications system of this type, there was a drawback that the operator of the system is requiered to always monitor the result of the comparison between the detected group number and the previously selected group number and to control each time the frequency scanning operation of the system.

SUMMARY OF THE INVENTION

An object of the present invention is therefore to provide a radio communications system which is capable of automatically stopping the frequency scanning operation when the group number information reproduced from a tuner output signal is identical with the previously selected group number.

Another object of the present invention is to provide a radio communications system having the function of automatically stopping the frequency scanning operation by using a simple circuit construction.

According to the present invention, a radio communications system having a plurality of channels, comprises a receiving part for receiving an RF signal transmitted by another station and for reproducing an audio output signal, a frequency scanning means for sequentially shifting the tuning frequency of the receiving part, group number detector means for detecting a presence of a carrier signal on each of the channels, and picking up group number information from the carrier signal, and means for stopping an operation of the frequency scanning means when the group number picked up by the group number detector means is identical with a preselected group number.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following description taken in conjunction with the accompanying drawings which are given by way of illustration only, and thus are not limitative of the present invention, and wherein.

DETAILED DESCRIPTION OF THE PREFERRED EMBODIMENTS

Figure 1:
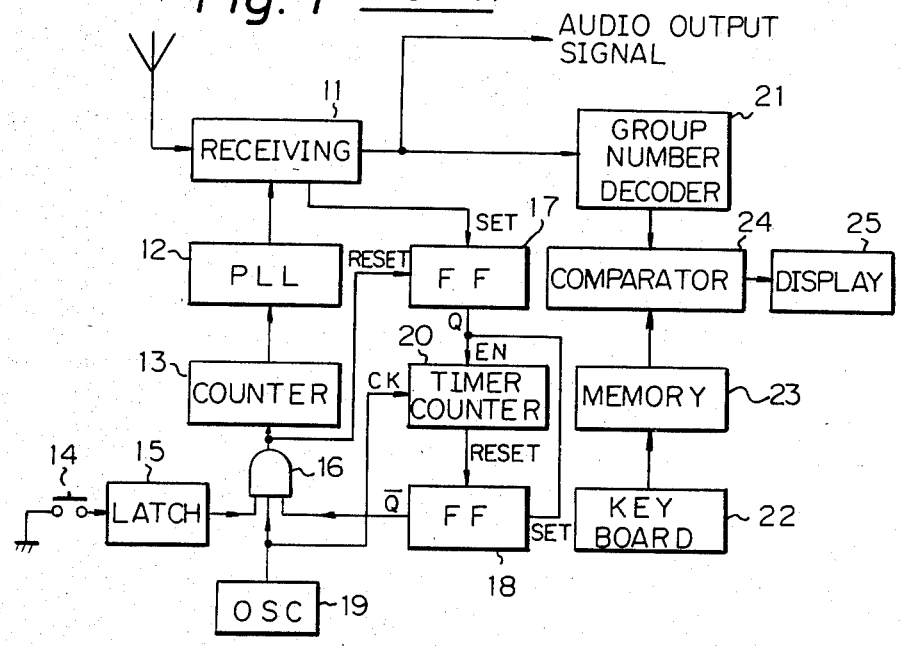
FIG. 1 is a block diagram showing an example of the circuit construction of the conventional radio communications system.

Before entering into the explanation of the embodiment of the present invention, reference is first made to FIG. 1, in which an example of the conventional radio communications system is illustrated.

As shown, an RF signal from an antenna is applied to a receiving part 11 in which the input RF signal is amplified and treated by a detection process to provide an audio output signal. In order to vary the receiving channel frequency of the receiving part 11, there is provided a PLL (Phase Locked Loop) circuit 12 which is controlled in accordance with a content of a counter 13. More specifically, a dividing ratio of a programmable divider provided in the PLL circuit 12 is controlled in accordance with the content of the counter 13, and consequently, the control of an oscillating frequency of a VCO (Voltage Controlled Oscillator) provided in the PLL circuit 12 takes place. Then, the receiving channel frequency is varied in accordance with the frequency of the output signal of the VCO.

In addition to the above mentioned receiving part of the system, there are provided circuit portions for the so-called scanning operation in which the receiving channel frequency is sequentially shifted and the presence of the signal on the selected channel is detected each time. Namely, there is provided a scanning start switch 14 whose output signal is memorized by a latch circuit 15. The signal memorized in the latch circuit 15 is then applied to a three input AND gate 16 and used as one of control signals of the open and close operation of the AND gate 16.

When the presence of the carrier signal is detected at the receiving part 11, then a flip flop 17 whose set input terminal is connected to the receiving part 11, is set in accordance with a set signal produced in the receiving part 11. Also, another flip flop 18 whose set input terminal is connected to a Q output terminal of the flip flop 17, is set in response to the set timing of the flip flop 17. A $\bar{Q}$ output signal of this flip flop 18 is used as another control signal of the open and close operation of the gate 16. Further, an output signal from an oscillator 19 is applied to one of the input terminals of the gate 16, so that a clock pulse signal from the oscillator 19 is applied to the counter 13 when both of the output signal of the latch circuit 15 and the $\bar{Q}$ output signal of the flip flop 18 are at high level.

On the other hand, a counter circuit 20 for the timer operation (a timer counter) is triggered in accordance with the set timing of the flip flop 17, and start to count the number of clock pulses from the oscillator 19 and then resets the flip flop 18 after the elapse of a predetermined time period. Also, the resetting of the flip flop 17 is executed by means of the output signal of the gate 16.

In addition, there is provided a group number decoder 21 for decoding a group number from a signal picked up from the audio output signal of the receiving part 11. The thus obtained group number is, at a comparator 24, compared with a content of a memory 23 which stores a group number designated by a user via a key board 22. Further, a display device 25 is provided for notifying the user of a state in which the decoded group number and the designated group number is identical with each other.

With this circuit construction, when the scan start switch 14 is pressed by the user, then the latch circuit 15 holds the signal from the scan start switch 14 and provide the high level output signal to the gate 16. Since the flip flop 18 is reset and produces a high level Q output signal in this state, the gate 16 is opened and the clock pulse signal is applied to the counter 13. In accordance with the content of the counter 13, the tuning frequency is sequentially shifted. If a carrier signal is detected at some receiving frequency, then the flip flop 17 is set and it triggers the timer counter 20 by means of the Q output signal thereof, and also sets the flip flop 18. With this operation, the gate 16 is closed and the closed state is maintained for the predetermined time period in accordance with the operation of the timer counter 20. Therefore, the application of the clock pulse signal is stopped and the tuning frequency remains unchanged for the predetermined time period. During this time period, the group number decoder 21 is activated and for example, picks up a group number information of twenty bits and then decodes it to the signal indicative of the group number. The thus produced group number is then compared with a group number previously designated by the user and stored in the memory 23. The result of the comparison is then displayed on the display device 25 and the user is required no operation if the group numbers are not identical with each other. Subsequently, the flip flop 18 is returned to the reset state after a predetermined time period and the gate 16 is opened to allow the application of the clock pulse signal to the counter 13 and causes the change in the receiving frequency. This sequence is repeated until the decoded group number and the designated group number become identical with each other.

When the group numbers become identical with each other, the user is required to operate such a device as a stop switch (preferably provided on a control panel of the system) to release the latch circuit 15 from the latched state. In the case of this type of conventional system, however, as mentioned before, there is a drawback that the operator is required to keep his or her eyes on the display device so as to judge the necessity of operating the scan stop switch.

Figure 2:
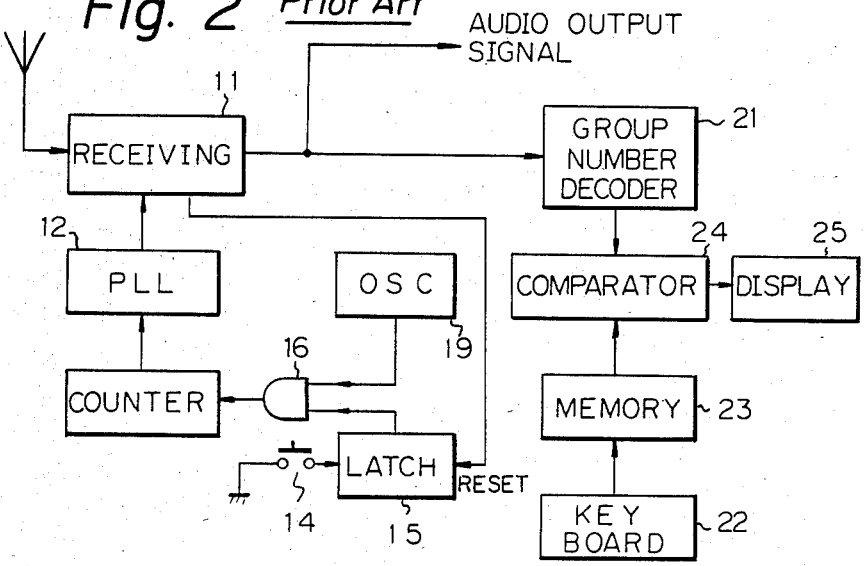
FIG. 2 is a block diagram showing another example of the circuit construction of the conventional radio communications system.

FIG. 2 shows another example of the conventional communications system which has the function of the detection of the coincidence of the decoded group number and the designated group number. In FIG. 2, like reference numerals used in FIG. 1 denote like parts and explanation thereof are omitted.

As shown, the gate 16 used in this example has two input terminals and the clock signal from the oscillator is on/off controlled in accordance with the latch output signal of the latch circuit 15. With this feature, the flip flops 17 and 18, and timer counter 20 used in the system of FIG. 1 are eliminated. The latch circuit 15 is reset by a carrier detection signal of the receiving part 11. The other circuit construction of the system is the same as that of the system of FIG. 1.

In the case of this example, the latch circuit 15 is actuated in response to the operation of the start switch 14 and opens the gate 16. Then, the clock pulse signal is applied to the counter 13 to shift the receiving channel frequency. If the receiving carrier signal is present in this state, the latch circuit 15 is reset and the decoding of the group number, judgement of the coincidence of the decoded group number and the designated group number is executed. The result of the judgement is notified to the user by means of the display device. The shift to the other receiving channel is performed when the user presses the start switch 14 once more. Since the operation of this system is stopped only when the carrier signal is present, it is necessary to press the start switch 14 again if the group numbers are not identical with each other. Thus, there is also the drawback that the operation of the system is rather troublesome.

Figure 3:
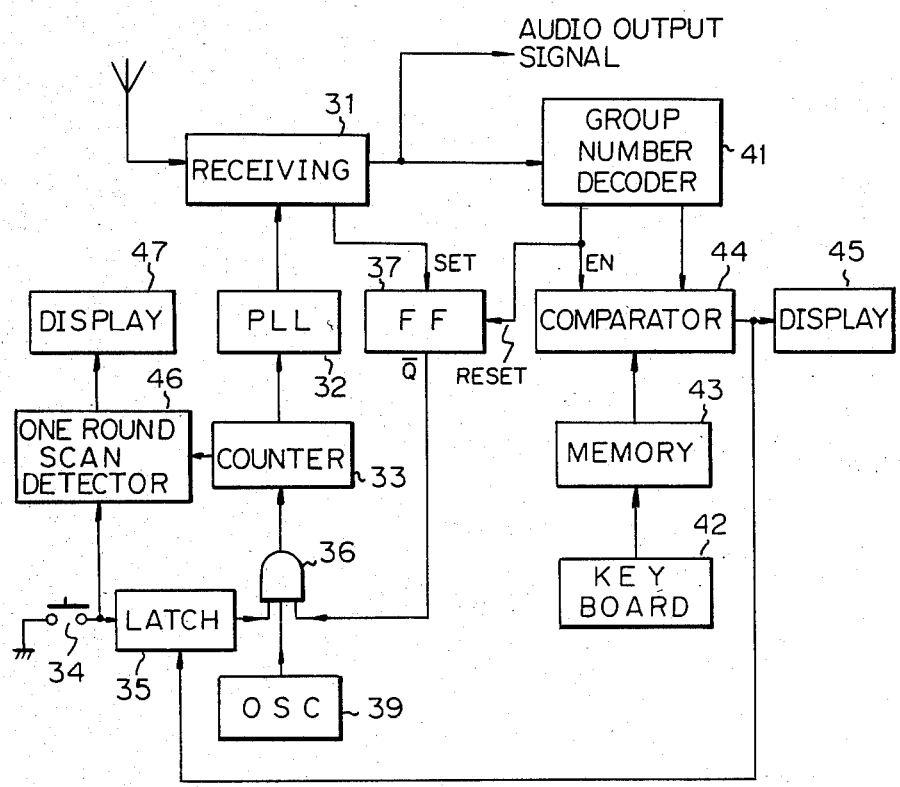
FIG. 3 is a block diagram of the embodiment of the radio communications system according to the present invention.

Referring to FIG. 3, an embodiment of the radio communications system according to the present invention will be explained hereinafter.

As shown, an RF signal from an antenna is applied to a receiving part 31 in which the input RF signal is amplified and treated by a detection process to provide an audio output signal. In order to vary the receiving channel frequency of the receiving part 31, there is provided a PLL (Phase Locked Loop) circuit 32 which is controlled in accordance with a content of a counter 33. More specifically, a dividing ratio of a programmable divider provided in the PLL circuit 32 is controlled in accordance with the content of the counter 33, and consequently, an oscillating frequency of a VCO (Voltage Controlled Oscillator) provided in the PLL circuit 32 is further controlled. Then, the receiving channel frequency is varied in accordance with the frequency of the output signal of the VCO.

In addition to the above mentioned receiving part of the system, there are provided circuit elements for the so-called scanning operation in which the receiving channel frequency is sequentially shifted and the presence of the signal on the selected channel is sequentially detected. Namely, there is provided a scanning start switch 34 whose output signal is memorized by a latch circuit 35. The signal memorized in the latch circuit 35 is then applied to a three input AND gate 36 and used as one of control signals of the open and close operation of the AND gate 36.

When the presence of the carrier signal is detected at the receiving part 31, then a flip flop 37 whose set input terminal is connected to the receiving part 31, is set and a $\overline{Q}$ output signal of this flip flop 37 is applied to the gate 36 as another control signal of the open and close operation of the gate 36. Further, an output signal from an oscillator 39 is applied to one of the input terminals of the gate 36, so that a clock pulse signal from an oscillator 39 is applied to the counter 33 when both of the output signal of the latch circuit 35 and the output signal of the flip flop 37 are at high level.

In addition, there is provided a group number decoder 41 for decoding a group number from a signal picked up from the audio output signal of the receiving part 31. The thus obtained group number is, at a comparator 44, compared with a content of a memory 43 which stores a group number designated by a user via a key board 42. Further, a display device 45 is provided for notifying the user of a state in which the decoded group number and the designated group number is identical with each other.

The reset operation of the flip flop 37 is timed with the trailing edge of a detection pulse signal which is produced when the group number is decoded by the group number decoder 41. On the other hand, the triggering of the comparison operation of the comparator 44 is timed with the leading edge of the detection pulse signal. Further, the latch circuit 35 is reset when the output signal of the comparator 44 indicates the coincidence of the group numbers. Since the reset operation of the latch circuit 35 by means of the output signal of the comparator 44 takes place earlier than the reset operation of the flip flop 37, the timing of closing of the gate 36 is synchronized with the reset timing of the latch circuit 35.

In addition, there is provided a one round scanning detector 46 which is triggered by the scan start switch 34. The one round scanning detector 46 detects the contents of the counter 33 and when the scanning is performed throughout the range of the receiving channels, it produces a drive signal of a display device 47 for indicating that the scanning is performed throughout the whole range of the tuning frequency.

With this construction, the communications system operates as follows. When the start switch 34 is pressed, the output signal from the scan start switch 34 is latched by the latch circuit 35, and the gate 36 is opened to transmit the clock pulse signal to the counter 33. In this state, the tuning frequency is shifted as was the case in the conventional arrangement.

If the receiving carrier signal is present, the flip flop 37 is set and the $\overline{Q}$ output level turns low, and the gate 36 is closed to hold the receiving frequency. At this point of time, the group number is decoded in the group number decoder 41 and a detection output pulse signal is generated therefrom. In synchronization with this detection pulse signal, the comparator 44 starts its operation. If, in this state, the group number stored in the memory 43 and the decoded group number is not identical with each other, the latch circuit 35 is not reset and keeps its latched state. Since the flip flop 37 is reset at the timing of the trailing edge of the output signal of the group number decoder 41, the $\overline{Q}$ output signal thereof turns high to open the gate 36 and transmit the clock pulse signal to the counter 33. Thus, the receiving frequency is shifted to the next channel.

If the stored group number and the decoded group number are identical with each other, the latch circuit 35 is reset in accordance with the detection signal of the incidence and the latch circuit 35 is reset to close the gate 36. Therefore, the content of the counter 33 at this moment is maintained to hold the receiving frequency and the display of the coincidence of the designated and the decoded group number is made on the display device 45.

When the start switch 34 is operated, the content of the counter 33 at the time of the operation of the start switch 34 is memorized in the memory means provided in the one round scan detector 46. Then, the varying content of the counter 33 is compared with this memorized content and an output signal is produced when the content of the counter 33 becomes identical with the memorized content of the one round scan detector 46. With this output signal, the display device 47 is controlled to indicate the completion of the one round scanning.

It will be appreciated from the foregoing that according to the present invention, there is provided a system which can automatically stop the frequency scanning operation by using very simple circuit construction. Therefore, an operator of the system is no more required to do rather troublesome steps of operation.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention. As an example, the display devices 45 and 47 used in the preferred embodiment can be replaced by means for generating an audible tone such as a buzzer.

What is claimed is:

1. A radio communications system having a plurality of channels, comprising:

a receiving part for receiving an RF signal transmitted by another station and for reproducing an audio output signal;

a frequency scanning means for sequentially shifting the tuning frequency of said receiving part, said frequency scanning means including an oscillator for generating a clock signal of a predetermined frequency, a counter means for counting said clock signal, a Phase Locked Loop frequency synthesizer means for generating a frequency signal for controlling the tuning frequency of the receiving part in accordance with the content of said counter means, a gate means for controlling the transmission of said clock signal to said counter means, a scan start switch for generating a signal to be applied to the gate means as a gate control signal, and a latch means for latching said signal generated by the scan start switch;

group number detector means for detecting a presence of a carrier signal on each of said channels, and for picking up group number information from said carrier signal, said group number detector including means for producing a pulse signal when the group number information is detected from the carrier signal; and means for stopping operation of said frequency scanning means when said group number picked up by said group number detector means is identical with a preselected group number, wherein said means for stopping the operation of the frequency scanning means comprises a flip flop to be set when the carrier signal is detected in the receiving part and to be reset at the timing of a trailing edge of said pulse signal generated by the group number detector means whose $\overline{Q}$ output signal is applied to said gate means as a gate control signal, and comparator means to be triggered at a timing of a leading edge of said pulse signal generated by the group number detector means to compare said group number information with a preselected group number, and to produce a reset signal of said latching means when the detected group number information is identical with the preselected group number.

2. A radio communications system as set forth in claim 1, including means responsive to said reset signal of the comparator for displaying a condition that the detected group number information is identical with the preselected group number.

* * * * *